US010811527B2

(12) United States Patent
Moens et al.

(10) Patent No.: US 10,811,527 B2
(45) Date of Patent: Oct. 20, 2020

(54) ELECTRONIC DEVICE INCLUDING HIGH ELECTRON MOBILITY TRANSISTORS

(71) Applicant: SEMICONDUCTOR COMPONENTS INDUSTRIES, LLC, Phoenix, AZ (US)

(72) Inventors: Peter Moens, Erwetegem (BE); Abhishek Banerjee, Kruibeke (BE); Piet Vanmeerbeek, Sleidinge (BE)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 0 days.

(21) Appl. No.: 16/123,115

(22) Filed: Sep. 6, 2018

(65) Prior Publication Data

US 2020/0083361 A1    Mar. 12, 2020

(51) Int. Cl.
| | |
|---|---|
| *H01L 29/778* | (2006.01) |
| *H01L 29/423* | (2006.01) |
| *H01L 29/417* | (2006.01) |
| *H01L 27/07* | (2006.01) |
| *H01L 29/47* | (2006.01) |
| *H01L 29/66* | (2006.01) |

(Continued)

(52) U.S. Cl.
CPC ...... *H01L 29/7786* (2013.01); *H01L 27/0705* (2013.01); *H01L 29/0649* (2013.01); *H01L 29/41725* (2013.01); *H01L 29/42316* (2013.01); *H01L 29/47* (2013.01); *H01L 29/66462* (2013.01); *H01L 29/872* (2013.01)

(58) Field of Classification Search
CPC ............. H01L 29/7786; H01L 27/0722; H01L 27/0711; H01L 27/0705; H01L 29/66462
See application file for complete search history.

(56) References Cited

U.S. PATENT DOCUMENTS

| | | | | |
|---|---|---|---|---|
| 5,047,811 A | * | 9/1991 | Miyano | ............... H01L 29/1029 257/194 |
| 2012/0267642 A1 | | 10/2012 | Jeon et al. | |

(Continued)

OTHER PUBLICATIONS

Eum et al.; "Highly Reliable GaN MOS-HFET with High Short Circuit Capability"; 29th International Symposium on Power Semiconductor Devices and ICs; 2017; pp. 195-198.

(Continued)

*Primary Examiner* — Wael M Fahmy
*Assistant Examiner* — Sarah K Salerno
(74) *Attorney, Agent, or Firm* — Abel Schillinger, LLP

(57) ABSTRACT

An electronic device can include a drain electrode of a high electron mobility transistor overlying a channel layer; a source electrode overlying the channel layer, wherein a lowermost portion of the source electrode overlies at least a portion of the channel layer; and a gate electrode of the high electron mobility transistor overlying the channel layer; and a current limiting control structure that controls current passing between the drain and source electrodes. The current limiting control structure can be disposed between the source and gate electrodes, the current limiting control structure can be coupled to the source electrode and the first high electron mobility transistor, and the current limiting control structure has a threshold voltage. The current limiting control structure can be a Schottky-gated HEMT or a MISHEMT.

20 Claims, 6 Drawing Sheets

(51) Int. Cl.
    *H01L 29/06*     (2006.01)
    *H01L 29/872*     (2006.01)

(56) References Cited

U.S. PATENT DOCUMENTS

| | | |
|---|---|---|
| 2013/0087803 A1 | 4/2013 | Kizilyalli et al. |
| 2014/0021511 A1 | 1/2014 | Jeon et al. |
| 2014/0021514 A1 | 1/2014 | Jeon et al. |
| 2014/0035003 A1 | 2/2014 | Rieger et al. |
| 2014/0091312 A1 | 4/2014 | Jeon et al. |
| 2014/0225163 A1 | 8/2014 | Briere |
| 2014/0353673 A1* | 12/2014 | Ito ................ H01L 29/2003 257/76 |
| 2015/0263103 A1* | 9/2015 | Saito ............. H01L 29/7787 257/76 |

OTHER PUBLICATIONS

Oeder et al.; "Experimental Study of the Short Circuit Performance for a 600V Normally-Off p-Gate GaN HEMT"; 29th International Symposium on Power Semiconductor Devices and ICs; 2017; pp. 211-214.

Monch et al.; "Quasi-normally-off GaN Gate Driver for High Slew-Rate D-Mode GaN-on-Si HEMTs"; Proceedings of the 27th International Symposium on Power Semiconductor Devices & IC's; 2015; pp. 373-376.

Wu et al.; "Investigation of Dynamic Threshold Voltage Behavior in Semi-Floating Gate Transistor for Normally-Off AlGaN/GaN HEMT"; IEEE Journal of Electronic Devices; 2017; pp. 1171-21.

U.S. Appl. No. 15/977,051, filed May 11, 2018; Roig-Guitart et al., Specification pp. 1-20, Drawing sheets 1-8.

* cited by examiner

ELECTRONIC DEVICE INCLUDING HIGH ELECTRON MOBILITY TRANSISTORS

FIELD OF THE DISCLOSURE

The present disclosure relates to electronic devices and circuits, and more particularly to, electronic devices and circuits including transistors and current limiting control structures.

RELATED ART

High electron mobility transistors can allow very high current to flow between their drains and sources. Such high current can cause the transistors to self-destruct in hundreds of nanoseconds. Thus, protection devices may be used; however, such devices can cause another complication or adverse consequence. A protection device may be located between the gate electrode and the drain electrode within the transistor. Such a configuration will change the electric field distribution between the gate electrode and drain electrode, and hence, will lower the blocking voltage capability of the transistor. To achieve the same blocking voltage, the distance between the gate electrode and drain electrode will have to be enlarged, which is undesirable. Another protection device can include a resistor; however, a resistor can increase on-state resistance, which is undesired. Another protection device can include multiple components and may significantly increase the area occupied the transistor and add source resistance, both of which are undesired. Further improvement of short circuit protection devices for high electron mobility transistors without the previously mentioned adverse issues is desired.

BRIEF DESCRIPTION OF THE DRAWINGS

Embodiments are illustrated by way of example and are not limited in the accompanying figures.

Figure 1:
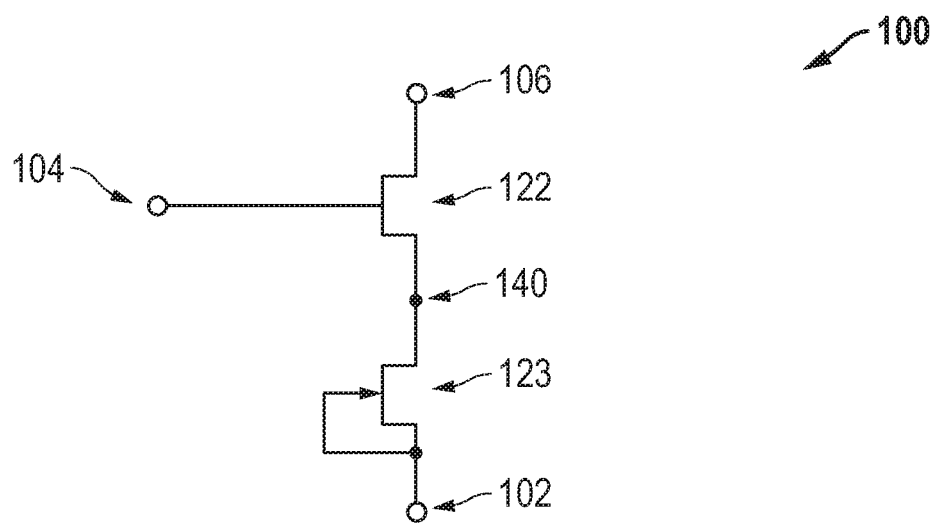
FIG. 1 includes a schematic diagram of circuit including a current limiting control structure and a high electron mobility transistor in accordance with an embodiment.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other embodiments can be used based on the teachings as disclosed in this application.

A III-V material is intended to mean a material that includes at least one Group 13 and at least one Group 15 element. A III-N material is intended to mean a semiconductor material that includes at least one Group 13 element and nitrogen.

The term "metal" or any of its variants is intended to refer to a material that includes an element that is within any of the Groups 1 to 12, and within Groups 13 to 16, an element that is along and below a line defined by atomic numbers 13 (Al), 31 (Ga), 50 (Sn), 51 (Sb), and 84 (Po). Metal does not include Si or Ge.

The term "semiconductor base material" refers to the principal material within a semiconductor substrate, region, or layer, and does not refer to any dopant within the semiconductor substrate, region, or layer. A boron-doped Si layer has Si as the semiconductor base material, and a C-doped GaN layer has GaN as the semiconductor base material.

The terms "comprises," "comprising," "includes," "including," "has," "having" or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read to include one, at least one, or the singular as also including the plural, or vice versa, unless it is clear that it is meant otherwise. For example, when a single item is described herein, more than one item may be used in place of a single item. Similarly, where more than one item is described herein, a single item may be substituted for that more than one item.

The use of the word "about", "approximately", or "substantially" is intended to mean that a value of a parameter is close to a stated value or position. However, minor differences may prevent the values or positions from being exactly as stated. Thus, differences of up to ten percent (10%) for the value are reasonable differences from the ideal goal of exactly as described.

Group numbers correspond to columns within the Periodic Table of Elements based on the IUPAC Periodic Table of Elements, version dated Nov. 28, 2016.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the semiconductor and electronic arts.

A current limiting control structure can be implemented with a high electron mobility transistor (HEMT) to help clamp drain current (Ids) without significantly affecting on-state resistance (Rdson). The current limiting control structure can keep the device from reaching short circuit conditions that can cause the device to self-destruct. Thus, the HEMT controls current flowing through the device, and the current limiting control structure limits the current flowing through the device when the HEMT is on. The current limiting control structure can be incorporated without incurring any significant increase in Rdson. In an embodiment, the current limiting control structure can be a Schottky-gated HEMT or a metal-insulator-semiconductor HEMT (MISHEMT). The current limiting control structure can be incorporated on the same die as the main HEMT and without increasing area occupied by the main HEMT when the Schottky-gated HEMT or MISHEMT would otherwise not be present. In a particular embodiment, the current limiting control structure can be incorporated without increasing the cell pitch of a device.

In an aspect, an electronic device can include a drain electrode of a HEMT overlying a channel layer; a source electrode overlying the channel layer, wherein a lowermost portion of the source electrode overlies at least a portion of the channel layer; a gate electrode of the HEMT overlying the channel layer; and a current limiting control structure that controls current passing between the drain and source electrodes. The current limiting control structure can be disposed between the source and gate electrodes, the current limiting control structure can be coupled to the source electrode and the HEMT, and the current limiting control structure has a threshold voltage.

In another aspect, a circuit can include a drain terminal, a source terminal, a gate terminal a first HEMT, and a second HEMT. The first HEMT can include a drain, a source, and a gate, wherein the drain of the first HEMT is coupled to the drain terminal, and the gate of the HEMT is coupled to the gate terminal. The second HEMT can include a drain, a source, and a gate, wherein: the drain of the second HEMT is coupled to the source of the first HEMT, the source and gate of the second HEMT are coupled to the source terminal, and the second HEMT is a Schottky-gated HEMT.

Figure 3:
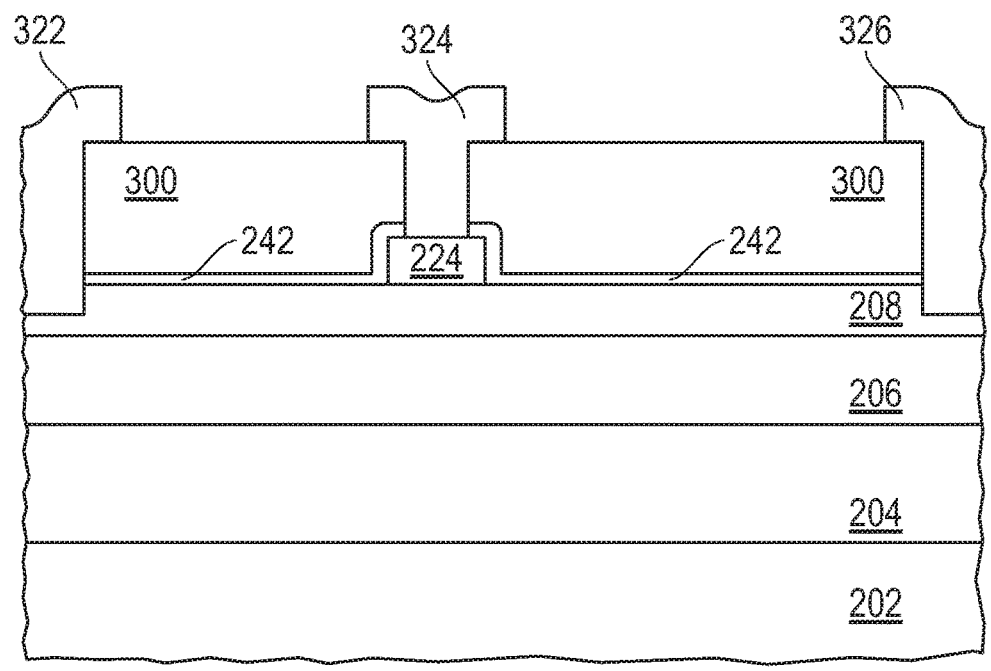
FIG. 3 includes an illustration of a cross-sectional view of the workpiece of FIG. 2 after forming an interlevel dielectric layer, source and drain electrodes, and a gate interconnect.
Figure 4:
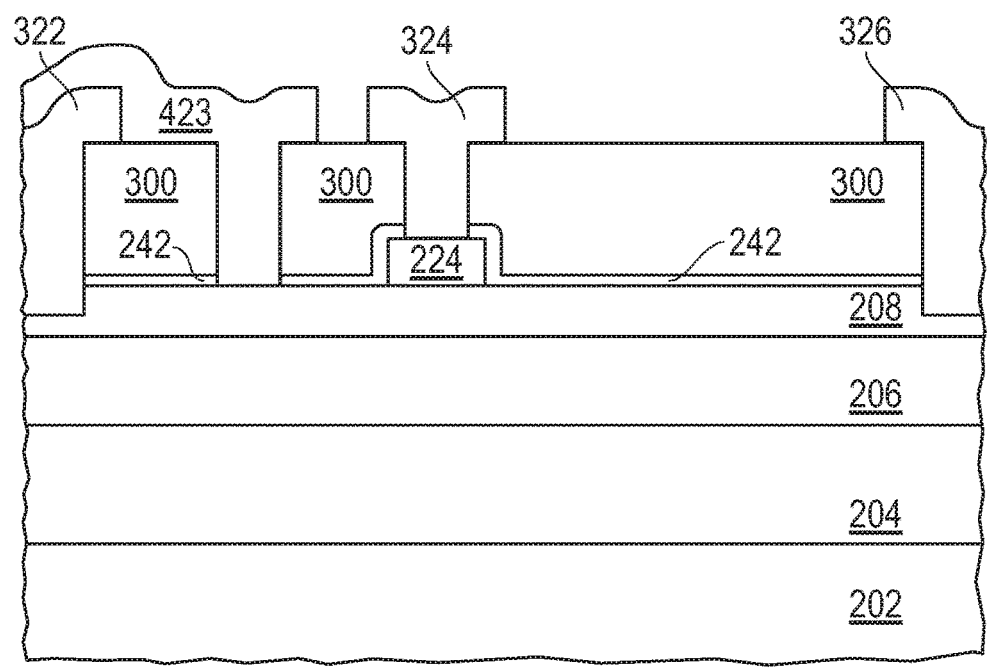
FIG. 4 includes an illustration of a cross-sectional view of the workpiece of FIG. 3 after forming a gate electrode having a Schottky contact in accordance with an embodiment.

In a first set of embodiments, the current limiting control structure can be implemented as a Schottky-gated HEMT between a source electrode and a gate electrode. FIG. 1 includes a schematic of a circuit 100 that includes a HEMT 122 that is coupled to the Schottky-gated HEMT 123. A drain terminal 106 is coupled to a drain of the HEMT 122, a gate terminal 104 is coupled to a gate of the HEMT 122. A source of the HEMT 122 and a drain of the Schottky-gated HEMT 123 are coupled to a node 140. A source and a gate of the Schottky-gated HEMT 123 are coupled to a source terminal 102. In a particular embodiment, the previously described couplings can be in the form of electrical connections. In an embodiment, the circuit 100 can be implemented within an electronic device in reference to FIGS. 2 to 4. Other designs may be used for the circuit 100, and thus, the embodiments as described and illustrated in FIGS. 2 to 4 are meant to be exemplary, non-limiting embodiments.

Figure 2:
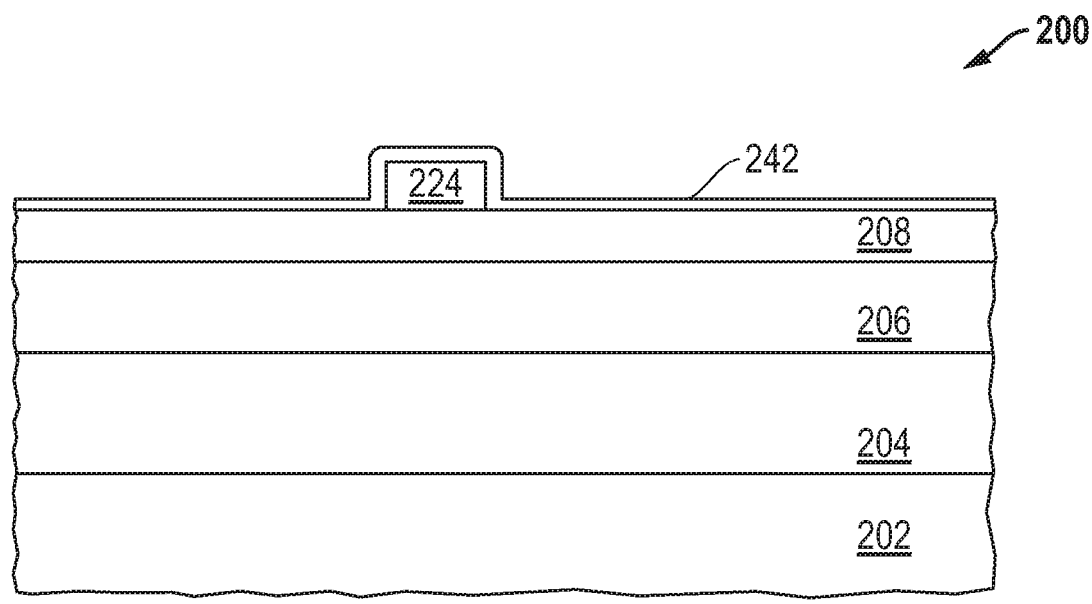
FIG. 2 includes an illustration of a cross-sectional view of a portion of a workpiece including a substrate, a buffer layer, a channel layer, a barrier layer, a gate electrode, and a dielectric layer.

FIG. 2 includes a cross-sectional view of a portion of a workpiece 200 where a physical instantiation of the circuit 100 is being formed. The workpiece 200 can include a substrate 202, a buffer layer 204, a channel layer 206, a barrier layer 208, a gate electrode 224, and a dielectric layer 242. The substrate 202 can include silicon, sapphire (monocrystalline $Al_2O_3$), silicon carbide (SiC), aluminum nitride (AlN), gallium oxide ($Ga_2O_3$), spinel ($MgAl_2O_4$), another suitable substantially monocrystalline material, or the like. The selection of the particular material and crystal orientation along the primary surface can be selected depending upon the composition of the overlying semiconductor layers.

The buffer layer 204 can include a III-N material, and in a particular embodiment, include $Al_aGa_{(1-a)}N$, where $0 \le a \le 1$. The composition of the buffer layer 204 may depend on the composition of the semiconductor base material of the channel layer 206 and the designed operating voltage of the HEMT. The composition of the buffer layer 204 can be changed as a function of thickness, such that the buffer layer 204 has a relatively greater aluminum content closer to the substrate 202 and relatively greater gallium content closer to the channel layer 206. In a particular embodiment, the cation (metal atoms) content in the semiconductor base material of the buffer layer 204 near the substrate 202 can be 10 atomic % to 100 atomic % Al with the remainder Ga, and the cation content in the semiconductor base material of the buffer layer 204 near the channel layer 206 can be 0 atomic % to 50 atomic % Al with the remainder Ga. In another embodiment, the buffer layer 204 can include a plurality of films. The buffer layer 204 can have a thickness in a range from approximately 1 micron to 6 microns.

The channel layer 206 can include $Al_zGa_{1-z}N$, where $0 \le z \le 0.1$ and have a thickness in a range from approximately 10 nm to 4000 nm. In a particular embodiment, the channel layer 206 is a GaN layer (z=0). The channel layer 206 may be unintentionally doped or doped with an electron donor (n-type) dopant or an electron acceptor (p-type) dopant. A high density two dimensional electron gas (2DEG) can be formed near portions of the interface of the channel layer 206 and the barrier layer 208 and is responsible for high mobility and lower resistivity of the transistor structure when in the on-state. In an enhancement-mode HEMT, a 2DEG may not be present under the gate structure when the HEMT is in an off-state. Any reduction of the 2DEG electrons will increase the on-resistance of the transistor. In an embodiment, the concentration of acceptors (when the carriers are electrons) or donors (when the carriers are holes) may be kept as low as reasonably possible.

In a particular embodiment, acceptors can include carbon from a source gas (e.g., $Ga(CH_3)_3$) when metalorganic chemical vapor deposition (MOCVD) is used to form the channel layer 206. In a particular embodiment, the lowest trap concentration is desired but may be limited by growth or deposition conditions and purity of the precursors. Thus, some carbon can become incorporated as the channel layer 206 is grown, and, such carbon can result in unintentional doping. The carbon content may be controlled by controlling the deposition conditions, such as the deposition temperature and flow rates. In an embodiment, the channel layer 206 has a carrier impurity concentration that is greater than 0 and less than $1\times10^{15}$ atoms/cm$^3$, less than $1\times10^{16}$ atoms/cm$^3$, or less than $1\times10^{17}$ atoms/cm$^3$ and in another embodiment, at most $1\times10^{16}$ atoms/cm$^3$ or at most $1\times10^{17}$ atoms/cm$^3$. In a further embodiment, the carrier impurity concentration is in a range from $1\times10^{15}$ atoms/cm$^3$ to $5\times10^{16}$.

In an embodiment, the channel layer 206 has a thickness that is at least 50 nm. When the thickness is less than 50 nm, a 2DEG may be more difficult to generate, maintain, or both. In another embodiment, the channel layer 206 has a thickness that is at most 5000 nm. In a particular embodiment, the thickness in a range from 50 nm to 300 nm can provide a sufficiently thick channel layer 206 to allow for the proper generation and maintaining of the 2DEG and still obtain a reasonable value for Rdson. Although not illustrated, a spacer layer may be used between the channel and barrier layers 206 and 208 if desired.

The barrier layer 208 can include a III-V semiconductor base material, such as a III-N semiconductor base material. In a particular embodiment, the barrier layer can include $Al_xIn_yGa_{1-x-y}N$, wherein $0 \le x \le 1$ and $0 \le y \le 0.3$. The barrier layer 208 can include a single film or a plurality of films. When the barrier layer 208 includes a plurality of films, the aluminum content can remain substantially the same or increase as distance from the channel layer 206 increases. As the aluminum content in the barrier layer 208 increases, the thickness of the barrier layer 208 may be relatively thinner. In an embodiment, the barrier layer 208 has a thickness of at least 5 nm, and in another embodiment, the barrier layer 208 has a thickness of at most 150 nm. In a particular embodiment, the barrier layer 208 has a thickness in a range from 20 nm to 90 nm.

The buffer layer 204, the channel layer 206, and barrier layer 208 can be formed using an epitaxial growth technique, and thus, the barrier layer 208, the channel layer 206, and at least a portion of the buffer layer 204 can be monocrystalline. In a particular embodiment, metal-containing films can be formed using metalorganic chemical vapor deposition.

The gate electrode 224 overlies the barrier layer 208. The gate electrode 224 can include a gate electrode layer that includes a p-type semiconductor material. In an embodiment, the p-type semiconductor material can include p-type doped $ALGa_{1-c}N$ wherein $0 \le c \le 1$. The p-type dopant can include Mg, Zn, Cd, or the like. The p-type semiconductor material can be monocrystalline or polycrystalline. The gate electrode layer can have a dopant concentration of at least $1\times10^{18}$ atoms/cm$^3$. In another embodiment, the dopant concentration is at most $1\times10^{21}$ atoms/cm$^3$. The gate electrode layer can be formed using any of the techniques that can be used in forming the channel layer 206 or the barrier layer 208. The p-type dopant can be incorporated in-situ or introduced into the gate electrode layer after deposition.

The gate electrode layer can be patterned to achieve the shape of the gate electrode 224 for the enhancement-mode HEMT 122 being formed. A portion of the gate electrode layer lying outside the gate region can be removed using a technique that does not significantly etch the barrier layer 208. When the gate electrode layer includes p-type GaN, the gate electrode layer can be dry etched using a fluorine chemistry, such as $SF_6$, $CHF_3$, $NF_3$, or the like. Aluminum-containing films or layers are not significantly etched using a fluorine chemistry, as $AlF_3$ forms and stops further etching of the aluminum-containing films or layers. Thus, the barrier layer 208 is not significantly etched when forming the gate electrode 224.

In another embodiment (not illustrated), access regions may be formed. A sacrificial structure can be formed within the gate region, and the access regions can be grown over exposed portions of the barrier layer 208. After removing the sacrificial structure, the gate electrode 224 can be formed within the gate region. Thus, different process flows may be used without deviating from the concepts as described herein.

The dielectric layer 242 is formed over the barrier layer 208 and gate electrode 224. The dielectric layer 242 can include a nitride, an oxide, or an oxynitride. An exemplary material can include $Si_3N_4$, $Al_2O_3$, $ZrO_2$, $HfO_2$, $SiO_2$, $TiO_2$, $Ta_2O_5$, $Nb_2O_3$, another suitable metal oxide, or a corresponding oxynitride. The dielectric layer 242 can be deposited at a temperature of at least 1000° C. If the deposition does not allow such a high temperature, some or all of the dielectric layer 242 can be deposited and then annealed at a temperature of at least 600° C. For example, for ALD, the deposition may be at a temperature in a range from 300° C. to 600° C. The dielectric layer 242 can be formed in an iterative process of a deposition of a monolayer of the metal precursor followed by an anneal of at least 600° C. The process can be iterated for at least two monolayers and for as many monolayers needed to achieve a desired thickness. In an embodiment, the dielectric layer 242 can be in a range from 1 nm to 120 nm. The formation of the dielectric layer 242 as previously described can help maintain the crystal quality of one or more of the underlying layers, such as the barrier layer 208.

FIG. 3 illustrates the workpiece after forming an interlevel dielectric (ILD) layer 300, source and drain electrodes 322 and 326 and a gate interconnect 324. The ILD layer 300 can be formed over the dielectric layer 242. The ILD layer 300 can include a single film or a plurality of films. The single film or each of the films can include an oxide, a nitride, or an oxynitride. The ILD layer 300 can have a thickness in a range from 20 nm to 2000 nm.

A contact opening for the gate interconnect 324 can extend through the ILD layer 300 and the dielectric layer 242 and land on the gate electrode 224. The contact openings for the source and drain electrode 322 and 326 can extend through the ILD layer 300 and the dielectric layer 242. In an embodiment, the contact openings for the source and drain electrodes 322 and 326 land on the barrier layer 208. In another embodiment, the contact openings for the source and drain electrodes 322 and 326 can extend through and part of, but not all, of the thickness of the barrier layer 208 or extend through all of the thickness of the barrier layer 208 and contact the channel layer 206.

A conductive layer is formed over the ILD layer 300 and within the contact openings. The conductive layer can include a single film or a plurality of films. In an embodiment, the conductive layer can include an adhesion film and a barrier film. Such films may include Ta, TaSi, Ti, TiW, TiSi, TiN, or the like. The conductive layer can further include a conductive bulk film. The bulk film can include Al, Cu, or another material that is more conductive than other films within the conductive layer. In an embodiment, the bulk film can include at least 90 wt. % Al or Cu. The bulk film can have a thickness that is at least as thick as the other films within the conductive layer. In an embodiment, the bulk film has a thickness in a range from 20 nm to 900 nm and, in a more particular embodiment, in a range from 50 nm to 500 nm. More or fewer films can be used in the conductive layer. The number and composition of the films within the conductive layer can depend on the needs or desires for a particular application. After reading this specification, skilled artisans will be able to determine the composition of the conductive layer that is tailored to their devices.

The conductive layer is patterned to form the source electrode 322, the gate interconnect 324, and the drain electrode 326. In another embodiment, the gate interconnect 324 may be formed at a different interconnect level as compared to the source and drain electrodes 322 and 326 and have a different composition. Lowermost portions of the source and drain electrodes 322 and 326 overlie at least a portion of the channel layer 206. Thus, the source and drain electrodes 322 and 326 are spaced apart from underlying layers, such as the buffer layer 204, by at least a portion of the channel layer 206. After patterning, the source and drain electrodes 322 and 326 and the gate interconnect 324 are annealed to form contacts between (1) each of the source and drain electrodes 322 and 326 and the gate interconnect 324 and (2) underlying layers in contact with the source and drain electrodes 322 and 326 and the gate interconnect 324. The contacts for the source and drain electrodes 322 and 326 can be ohmic. The contact for the gate interconnect 324 to the gate electrode 224 can be ohmic or Schottky. The anneal may be performed at a temperature of at least 530° C. for a time of at least 30 seconds. Whether the contact will be ohmic or Schottky type will depend on the composition of the conductive layer in the contact openings. For example, when the conductive layer includes Ti, a relatively lower anneal temperature and time may be used to form an ohmic contact to an underlying layer, as compared to when the conductive layer includes a refractory metal nitride, such as TiN.

FIG. 4 includes an illustration of the workpiece after forming a gate interconnect 423 that forms a Schottky contact at an interface between the gate interconnect 423 and an underlying semiconductor layer. The Schottky contact corresponds to the Schottky-gated HEMT 123 in FIG. 1. In the embodiment as illustrated in FIG. 4, the gate interconnect 423 contacts the source electrode 322, so that the gate and source of the Schottky-gated HEMT 123 are electrically connected to each other. The ILD layer 300 and the dielectric layer 242 are patterned to define a contact opening for the gate interconnect 423 that lands on the barrier layer 208. In another embodiment, the contact opening for the gate interconnect 423 can extend through and part of, but not all, of the thickness of the barrier layer 208 or extend through all of the thickness of the barrier layer 208 and contact the channel layer 206. The depth of the contact opening for the gate interconnect 423 may be the same or different from the depths of the contact openings for the source and drain electrodes 322 and 326.

A conductive layer is formed over the ILD layer 300 and within the contact opening and patterned to form the gate interconnect 423. The conductive layer may include a single film or a plurality of films. The work function of the single film or lowermost film within a plurality of films can be selected to achieve a desired threshold voltage for a Schottky-gated HEMT corresponding to the Schottky contact. In a particular embodiment, the work function can be selected to achieve a threshold voltage in a range from −1 V to −4 V. An example is TiN, with a work function of 4.55 eV, yielding a threshold voltage of −2 V. The other film(s) in the conductive layer may have a composition that is the same or different from the composition of the source and drain electrodes 322 and 326. A lowermost portion of the gate interconnect 423 overlies at least a portion of the channel layer 206. Thus, the gate interconnect 423 spaced apart from underlying layers, such as the buffer layer 204, by at least a portion of the channel layer 206. An anneal may or may not be performed after forming the gate interconnect 432. If anneal is performed, the anneal may be performed at a temperature less than 600° C. to reduce the likelihood of forming an ohmic contact. In a particular case, the anneal temperature used for the gate interconnect 432 is less than the anneal temperature used for the electrodes and interconnects 322, 324 and 326.

In the embodiment as illustrated in FIG. 4, a current limiting control structure includes the Schottky-gated HEMT 123 (as illustrated in FIG. 1) corresponding to the Schottky contact between the gate interconnect 423 and an underlying layer (e.g., the barrier layer 208) in contact with the gate interconnect 423. In the embodiment as illustrated, the Schottky-gated HEMT 123 has a Schottky diode with a cathode coupled to the source electrode 322 and an anode coupled to the barrier layer 208 at a location disposed laterally between the source electrode 322 and the gate interconnect 324.

Figure 5:
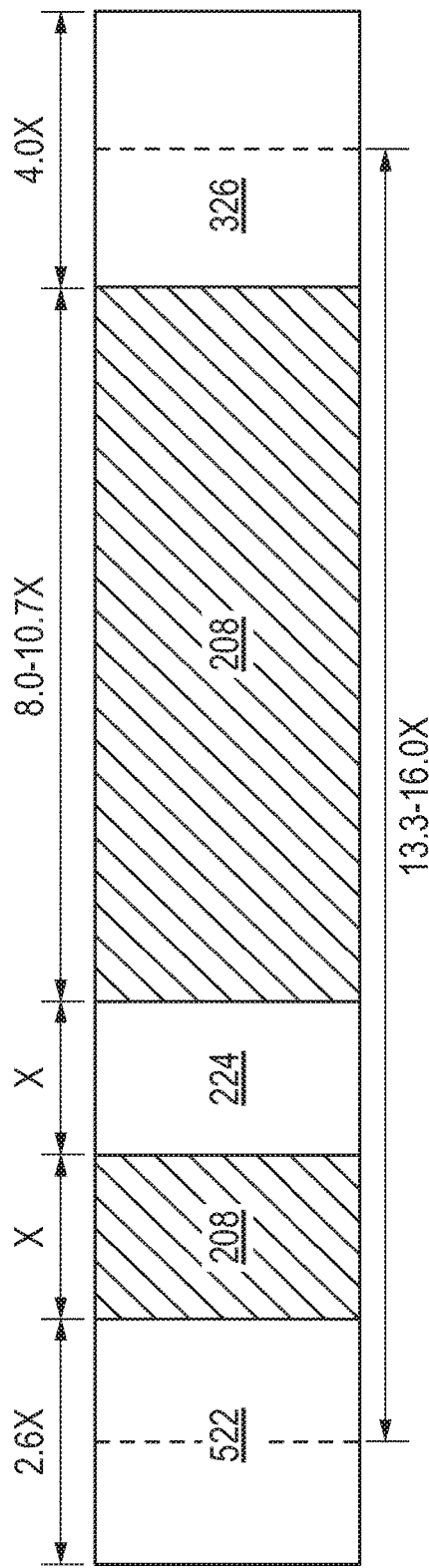
FIG. 5 includes a top view of a layout of a high electron mobility transistor without a gate electrode having a Schottky contact.
Figure 6:
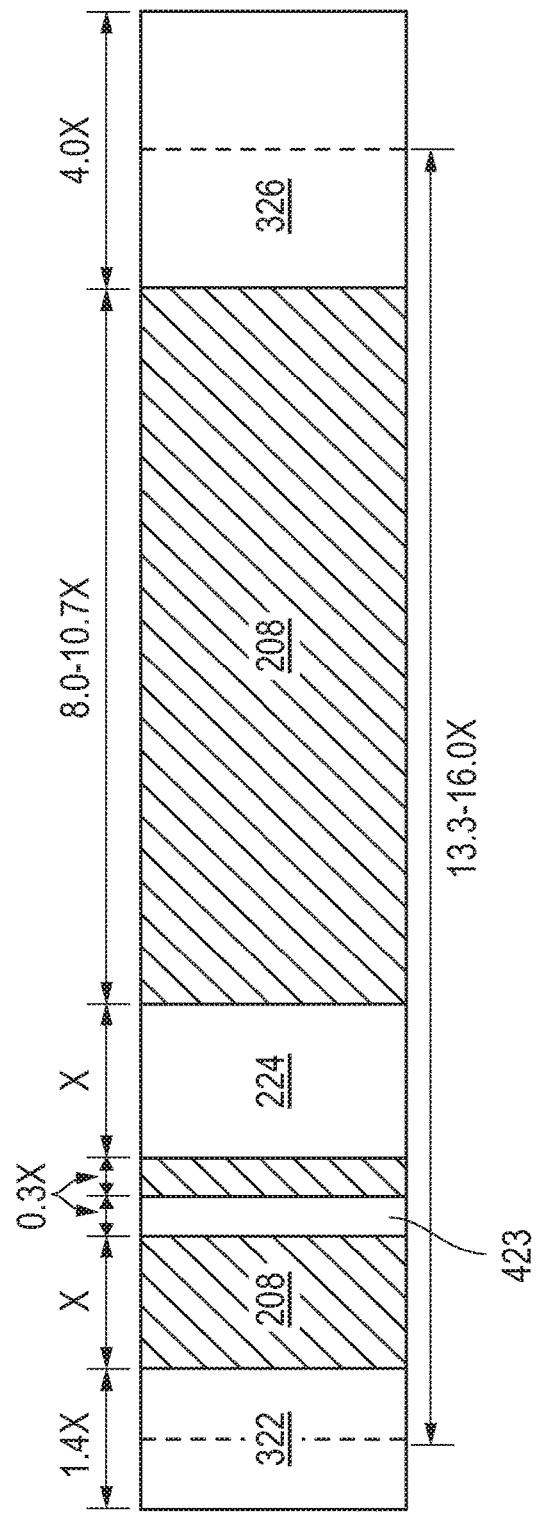
FIG. 6 includes a top view of a layout of a high electron mobility transistor with a gate electrode having a Schottky contact.

FIGS. 5 and 6 demonstrate that the current limiting control structure can be incorporated into a physical structure without increasing the area occupied by the structure. The illustrations in FIGS. 5 and 6 are at locations where the electrodes and interconnect contact the barrier layer 208. All dimensions are expressed as a factor of the gate length (dimension of the gate electrode 224 as measured in a direction of current flow through the HEMT when in the on-state). Although specific dimensions are provided below, such dimensions are provided to demonstrate that the cell pitch can be maintained with the addition of a current control limiting structure. Such specific dimensions are not meant to limit the scope of the claims as defined in the appended claims, and after reading this specification, skilled artisans will appreciate that other dimensions can be used for a particular application.

In FIGS. 5 and 6, the dimension of the gate length corresponds to "x", and thus, 1.4× corresponds to 1.4 times the gate length. FIG. 5 includes a top view of a layout that may be used for a HEMT without the Schottky contact, and FIG. 6 includes a top view of a layout that for a HEMT that includes the gate interconnect 423 that provides the Schottky contact (see FIG. 4) for the Schottky-gated HEMT 123 (FIG. 1). For both layouts, the cell pitch is in a range from 13.3 to 16.0 times the gate length. In FIGS. 5 and 6, the gate electrodes 224 have the same dimension, the drain electrodes 326 have the same dimension at 4.0 times the gate length, and the space between the gate and drain electrodes 224 and 326 are the same and in a range from 8.0 to 10.7 times the gate length.

The differences in the layouts are to the left-hand side of the gate electrodes 224. The dimension of source electrode 322 in FIG. 6 is 1.4 times the gate length, half of the dimension of the source electrode 522 in FIG. 5, which is 2.6 times the gate length. In FIG. 6, the gate interconnect 423 has a dimension that is 0.3 times the gate length, and the space between the gate interconnect 423 and the gate electrode 224 is 0.3 times the gate length. Thus, the source electrode 322 in FIG. 6 is narrower than the source electrode 522 to allow the gate interconnect 423 and corresponding space between the gate interconnect 423 and gate electrode 224 to be incorporated without increasing the cell pitch. Thus, a currently limiting control structure can be incorporated without having to increase the cell size.

One or more additional interconnect levels and a passivation layer may be formed over the workpiece. Each interconnect level can include an ILD layer and interconnects. A conductive layer can be used at each interconnect level. The conductive layer may be the same or different from the other conductive layers described earlier in this specification. A substantially completed electronic device has been formed. Referring to FIGS. 1 and 4, the source electrode 322 and the gate interconnect 423 can be coupled to the source terminal 102, the gate interconnect 324 can be coupled to the gate terminal 104, and the drain electrode 326 can be coupled to the drain terminal 106.

Figure 7:
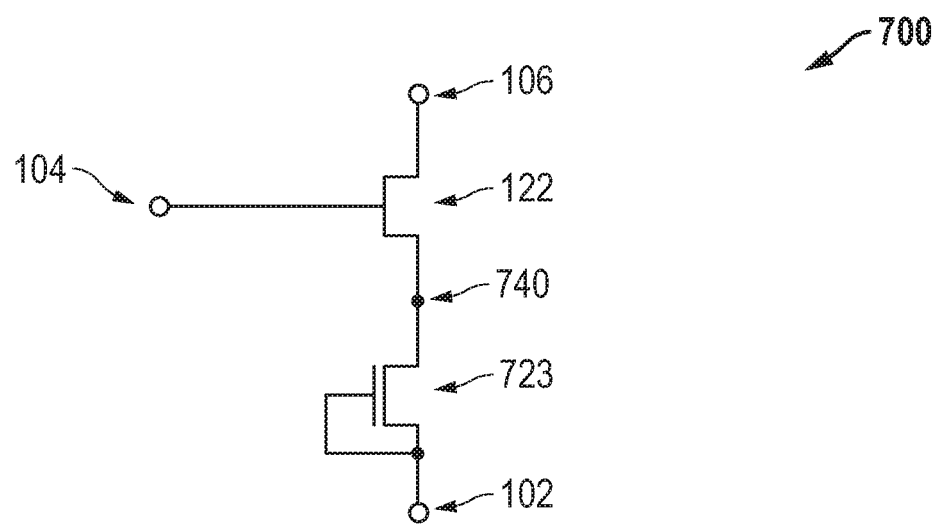
FIG. 7 includes a schematic diagram of circuit including a current limiting control structure and a high electron mobility transistor in accordance with another embodiment.

In a second set of embodiments, the current limiting control structure can be implemented as a MISHEMT, and in a particular embodiment, is a depletion-mode MISHEMT. FIG. 7 includes a schematic of a circuit 700 that includes the HEMT 122 that is coupled to the MISHEMT 723. A source of the HEMT 122 and a drain of the MISHEMT 723 are coupled to a node 740. A source and a gate of the MISHEMT 723 are coupled to the source terminal 102. In a particular embodiment, the previously described couplings can be in the form of electrical connections. In an embodiment, the circuit 700 can be implemented within an electronic device in reference to FIG. 8. Other designs may be used for the circuit 700, and thus, the embodiments as described and illustrated in FIG. 8 are meant to be exemplary, non-limiting embodiments.

Figure 8:
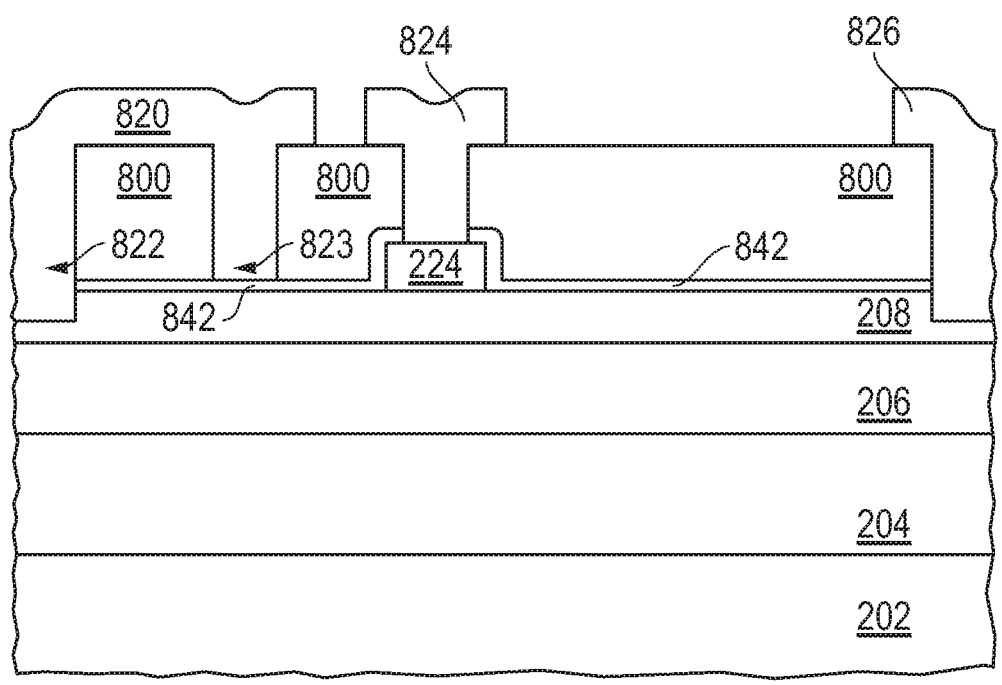
FIG. 8 includes an illustration of a cross-sectional view of the workpiece of FIG. 2 after forming an interlevel dielectric layer, source, gate, and drain electrodes, and a gate interconnect in accordance with another embodiment.

Many of the features illustrated in FIG. 8 are previously described with respect to FIGS. 2 to 4. After the gate electrode 224 is formed, a dielectric layer 842 is formed over the barrier layer 208 and the gate electrode 224. The dielectric layer 842 can include any of the materials and be formed using any of the techniques as previously described for the dielectric layer 242.

Figure 9:
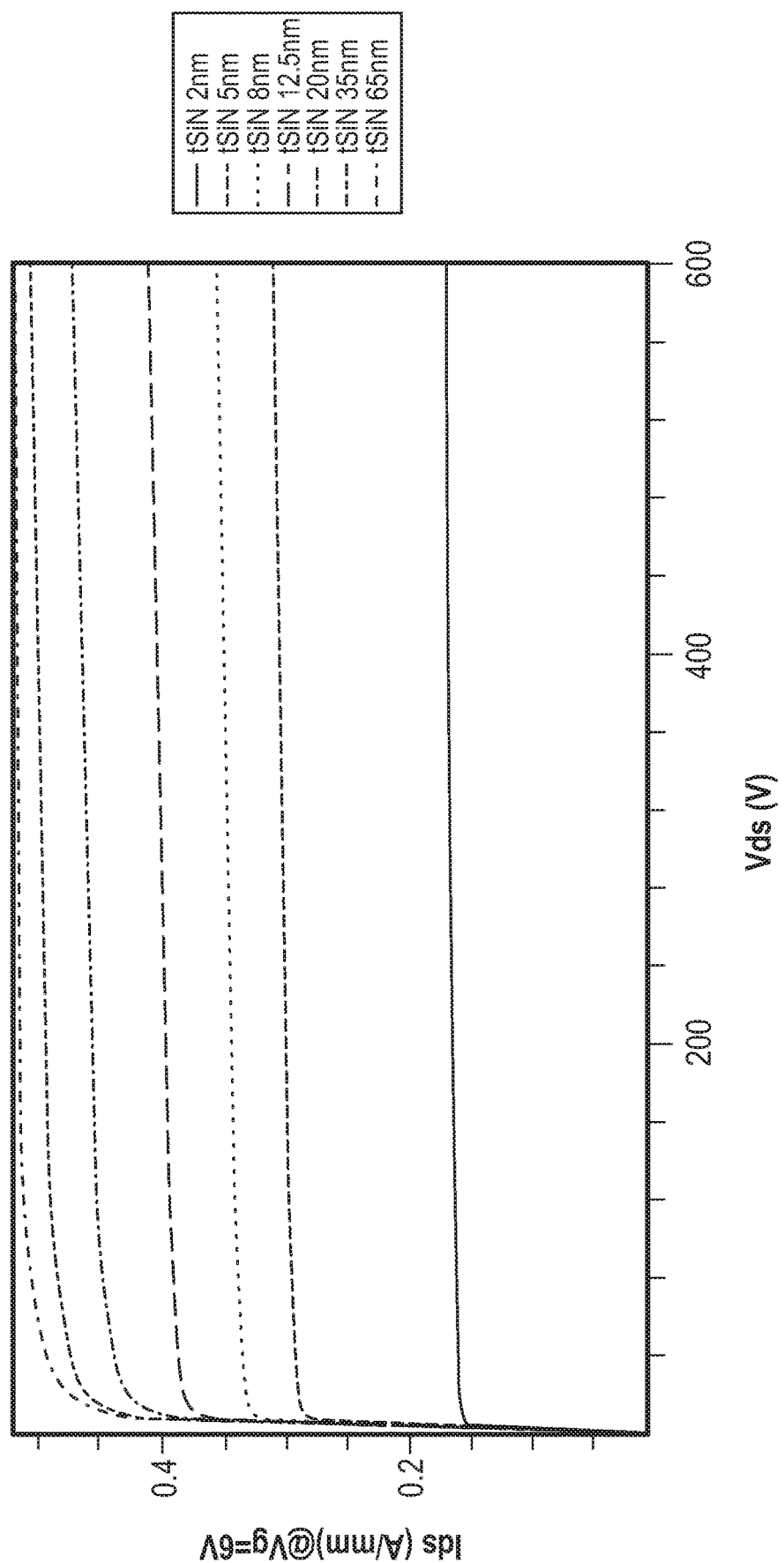
FIG. 9 includes plots of drain current as a function of drain voltage for different thicknesses of a dielectric layer.

The thickness of the dielectric layer 842 can be controlled to provide a desired clamping current. FIG. 9 includes a plot of a simulation of Ids as a function of drain voltage (Vds) for different dielectric layer thicknesses when the dielectric layer 842 includes $Si_3N_4$ and the gate voltage (Vgs) is at 6 V. As can be seen in FIG. 9, as the thickness of the dielectric layer 842 becomes thinner, Ids is clamped at lower values. When the thickness is 65 nm, Ids exceeds 0.5 A/mm and can cause the HEMT 122 to self-destruct in a few hundreds of nanoseconds. As can be seen in FIG. 9, as the thickness decreases, Ids decreases. At 20 nm, Ids is less than 0.5 A/mm, at 12.5 nm, Ids is less than 0.4 A/mm, at 8 nm, Ids is less than 0.35 A/mm, and at 5 nm, Ids reaches approximately 0.3 A/mm.

Figure 10:
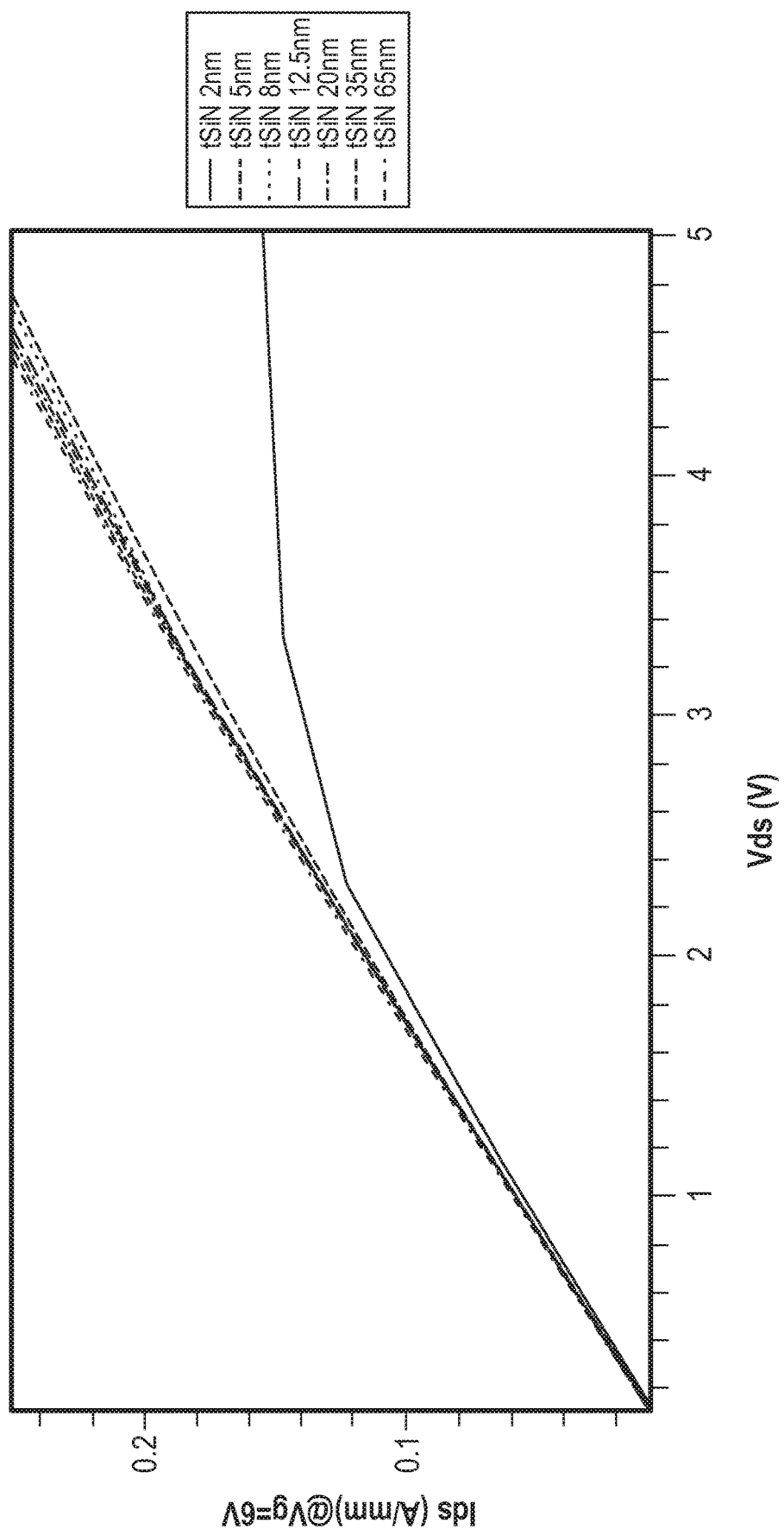
FIG. 10 includes an enlarged view of a portion of the plots in FIG. 9 for drain voltages in a range from 0 V to 5 V.

FIG. 10 includes an expanded portion of the plots in FIG. 9 with the expanded portion covering Vds in a range from 0 V to 5 V. At thicknesses of 5 nm and higher, Rdson is substantially the same for Vds in the range seen in FIG. 10. At a thickness of 2 nm, Rdson is higher at lower voltages, as evidenced by the shallower slope of the linear portion of the plot in the range from 0 V to 2 V. When the thickness is too low, Rdson can be adversely affected. After reading this specification, skilled artisans will be able to determine an acceptable combination of clamping current and Rdson for a particular application.

The concepts as previously described with respect to silicon nitride can be extended to other dielectric materials. Threshold voltage for a transistor is a function of capacitance, which is proportional to the permittivity of a dielectric material divided by the thickness of the dielectric material. For simplicity, relative permittivity (εr) is used. Relative permittivities are determined at 20° C. when applying a direct current voltage signal.

The previously described simulations for the dielectric layer 842 used silicon nitride at different thicknesses, including 2 nm and 12.5 nm. For $Si_3N_4$ at 2 nm, εr/t is 7.8/2 nm or 3.9 $nm^{-1}$, and for $Si_3N_4$ at 12.5 nm, εr/t is 7.8/12.5 nm or 0.62 $nm^{-1}$, where t is the thickness of the dielectric layer 842. Below is a table that includes different dielectric materials to illustrate how different thicknesses can be used to keep the capacitance substantially constant for a particular ratio of εr/t.

TABLE 1

Capacitances for Different Dielectric Materials

| Dielectric material | Relative permittivity (εr) | Thickness (nm) for εr/t ≈ 3.9 $nm^{-1}$ | Thickness (nm) for εr/t ≈ 0.62 $nm^{-1}$ |
|---|---|---|---|
| $Si_3N_4$ | 7.8 | 2.0 | 12.5 |
| $SiO_2$ | 3.9 | 1.0 | 6.3 |
| $Al_2O_3$ | 10.0 | 2.6 | 16 |
| $ZrO_2$ | 25 | 6.4 | 40 |
| $HfO_2$ | 27 | 6.9 | 43 |
| $Nb_2O_3$ | 41 | 10.5 | 65 |

After reading this specification, skilled artisans will appreciate that many other dielectric materials can be used for the dielectric layer 842 and by adjusting the thickness of the dielectric layer 842 for a desired capacitance across the dielectric layer 842.

Continuing with FIG. 8, an ILD layer 800, a drain electrode 826 and interconnects 820 and 824 are formed over the workpiece. The ILD layer 800, the drain electrode 826 and the gate interconnect 824 can be formed using the materials and techniques as previously described with respect to the ILD layer 300, the source and drain electrodes 322 and 326, and the gate interconnect 324. The contact openings for the source electrode 822 portion of the interconnect 820 and the drain electrode 826 can be formed using any of the techniques as previously described with respect to the contact openings for the source and drain electrodes 322 and 326. The contact opening for the gate interconnect 824 can be formed using any of the techniques as previously described with respect to the contact opening for the gate interconnect 324. The contact opening for the gate electrode 823 portion of the interconnect 820 can be formed using any of the techniques as previously described with respect to the contact openings for the source and drain electrodes 322 and 326, for the gate electrode interconnect 324, or using another technique. For example, the contact opening the for gate electrode 823 portion of the interconnect 820 can be tailored to etch though the ILD layer 800 and stop before significantly etching the dielectric layer 842, as the dielectric layer 842 and the ILD layer 800 can include different dielectric materials. In an embodiment, the ILD layer 800 is the patterned to define a contact opening for the gate electrode 823 portion of the interconnect 820 that lands on the dielectric layer 842.

A conductive layer is deposited over the ILD layer 800 and within the contact openings and patterned to form the interconnect 820 that includes source electrode 822 and gate electrode 823 portions, the gate interconnect 824, and the drain electrode 826. The conductive layer can include any of the compositions as previously described with respect to the conductive layer used to form the source and drain electrodes 322, 326 and the gate interconnect 324. The conductive layer can include a single film or a plurality of films. The work function of the single film or lowermost film within a plurality of films can be selected to achieve a desired threshold voltage for MISHEMT 723, which in FIG. 8 corresponds to the gate electrode 823 portion of the interconnect 820. The conductive layer is patterned to form the drain electrode 826 and the interconnects 820 and 824. In another embodiment, the interconnect 820 can be replaced by separate source and gate electrodes that can be connected using at least one different interconnect level. After reading this specification, skilled artisans will appreciate that many other process sequences can be used to form the source, gate, and drain electrodes 822, 823, and 826 and the gate interconnect 824.

One or more additional interconnect levels and a passivation layer may be formed over the workpiece. Each interconnect level can include an ILD layer and interconnects. A conductive layer can be used at each interconnect level. The conductive layer may be the same or different from the other conductive layers described earlier in this specification. A substantially completed electronic device has been formed. Referring to FIGS. 7 and 8, the interconnect 820 can be coupled to the source terminal 102, the gate interconnect 824 can be coupled to the gate terminal 104, and the drain electrode 826 can be coupled to the drain terminal 106.

Embodiments as described herein can include a current limiting control structure to help clamp Ids without significantly affecting Rdson. The current limiting control structure can keep the device from reaching short circuit conditions that can cause the device to self-destruct. In one embodiment, the current limiting control structure can be a Schottky-gated HEMT and may be incorporated between a source electrode and gate electrode of a HEMT where the cathode of the Schottky-gated HEMT is electrically connected to the source of the main HEMT that controls current flow through the circuit. In another embodiment, the current limiting control structure can be a MISHEMT and can be incorporated into the circuit, where the MISHEMT has its source and gate electrically connected to each other, and its drain is electrically connected to the source of the main HEMT that controls current flow through the circuit. The current limiting control structure (Schottky-gated HEMT or MISHEMT) can be incorporated on the same die and into the layout without increasing area occupied by the main HEMT when the Schottky-gated HEMT or MISHEMT is not present.

Many different aspects and embodiments are possible. Some of those aspects and embodiments are described below. After reading this specification, skilled artisans will appreciate that those aspects and embodiments are only illustrative and do not limit the scope of the present invention. Embodiments may be in accordance with any one or more of the items as listed below.

Embodiment 1. An electronic device can include:
a drain electrode of a first high electron mobility transistor overlying a channel layer;
a source electrode overlying the channel layer, wherein a lowermost portion of the source electrode overlies at least a portion of the channel layer;
a first gate electrode of the first high electron mobility transistor overlying the channel layer; and
a current limiting control structure that controls current passing between the drain and source electrodes, wherein:
the current limiting control structure is disposed between the source and first gate electrodes,
the current limiting control structure is coupled to the source electrode and the first high electron mobility transistor, and
the current limiting control structure has a threshold voltage.

Embodiment 2. The electronic device of Embodiment 1, wherein the current limiting control structure includes a second high electron mobility transistor, wherein the first and second high electron mobility transistors have different threshold voltages.

Embodiment 3. The electronic device of Embodiment 2, wherein the second high electron mobility transistor includes a Schottky-gated high electron mobility transistor.

Embodiment 4. The electronic device of Embodiment 2, wherein the first high electron mobility transistor is an enhancement-mode transistor, and the second high electron mobility transistor is a depletion-mode transistor.

Embodiment 5. The electronic device of Embodiment 2, wherein each of the first and second high electron mobility transistors includes a drain and a source, wherein the drain electrode is the drain of the first high electron mobility transistor, the source of the first high electron mobility transistor is coupled to the drain of the second high electron mobility transistor, and the source electrode is the source of the second high electron mobility transistor.

Embodiment 6. The electronic device of Embodiment 5, wherein the second high mobility electron transistor further includes a second gate electrode.

Embodiment 7. The electronic device of Embodiment 6, wherein the second high mobility electron transistor further includes a dielectric layer disposed between the second gate electrode and the channel layer.

Embodiment 8. The electronic device of Embodiment 7, wherein the dielectric layer has a relative permittivity and a thickness, wherein a ratio of the relativity permittivity divided by the thickness is at least 0.62 nm$^{-1}$.

Embodiment 9. The electronic device of Embodiment 8, wherein the ratio of the relative permittivity divided by the thickness is at most 3.9 nm$^{-1}$.

Embodiment 10. The electronic device of Embodiment 7, wherein the dielectric layer includes $Si_3N_4$, $Al_2O_3$, $ZrO_2$, $HfO_2$, $SiO_2$, $TiO_2$, $Ta_2O_5$, or $Nb_2O_3$.

Embodiment 11. The electronic device of Embodiment 1, wherein the threshold voltage of the current limiting control structure is in a range from −1 V to −4 V.

Embodiment 12. The electronic device of Embodiment 1, wherein the current limiting control structure is configured to limit current to at most 0.4 A/mm.

Embodiment 13. The electronic device of Embodiment 1, wherein:
the current limiting control structure is a second high electron mobility transistor including a drain, a source, and a gate,
the first high electron mobility transistor is an enhancement-mode transistor, the second high electron mobility transistor is a Schottky-gated transistor or a depletion-mode transistor,
the source of the first high electron mobility transistor is electrically connected to the drain of the second high electron mobility transistor,
the source and gate of the second high electron mobility transistor are electrically connected to the source terminal.

Embodiment 14. The electronic device of Embodiment 13, wherein the threshold voltage of the current limiting control structure is in a range from −1 V to −4 V, and the current limiting control structure is configured to limit current to at most 0.4 A/mm.

Embodiment 15. A process of forming an electronic device can include:
forming a first gate electrode of a first high electron mobility transistor;
forming a drain electrode of the first high electron mobility transistor over a channel layer;
forming a source electrode, wherein a lowermost portion of the source electrode overlies at least a portion of the channel layer; and forming a current limiting control structure that controls current passing between the drain and source electrodes, wherein:
the current limiting control structure is disposed between the source and first gate electrodes,
the current limiting control structure is coupled to the source electrode and the first high electron mobility transistor, and
the current limiting control structure has a threshold voltage.

Embodiment 16. The process of Embodiment 15, wherein:
forming the source electrode includes forming the source electrode such that it forms an ohmic contact with the channel layer or a barrier layer overlying the channel layer;
forming the drain electrode includes forming the drain electrode such that it forms an ohmic contact with the barrier layer or the channel layer; and
forming the current limiting control structure includes forming a Schottky-gated high electron mobility transistor by forming a Schottky contact between a metal-containing layer and the barrier layer or the channel layer.

Embodiment 17. The process of Embodiment 15, wherein forming the current limiting control structure includes forming a second gate electrode of a second high electron mobility transistor, wherein in a finished device, the second gate is electrically connected to the source electrode.

Embodiment 18. The process of Embodiment 17, wherein forming the current limiting control structure includes forming a dielectric layer before forming the second gate electrode, wherein the dielectric layer is part of the second high electron mobility transistor.

Embodiment 19. The process of Embodiment 15, wherein forming the first gate electrode includes forming a p-type semiconductor layer over a first gate region of the first high electron mobility transistor.

Embodiment 20. A circuit can include:
a drain terminal;
a source terminal;
a gate terminal;
a first high electron mobility transistor including a drain, a source, and a gate, wherein: the drain of the first high electron mobility transistor is coupled to the drain terminal, and the gate of the first high electron mobility transistor is coupled to the gate terminal; and
a second high electron mobility transistor including a drain, a source, and a gate, wherein:
the drain of the second high electron mobility transistor is coupled to the source of the first high electron mobility transistor,
the source and gate of the second high electron mobility transistor are coupled to the source terminal, and
the second high electron mobility transistor is a Schottky-gated high electron mobility transistor.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. An electronic device comprising:
a first high electron mobility transistor including:
a drain electrode overlying a channel layer;
a first gate electrode overlying the channel layer; and
a second high electron mobility transistor including:
a drain coupled to a source of the first high electron mobility transistor;
a source electrode overlying a channel layer; and
a second gate electrode electrically connected to the source electrode.

2. The electronic device of claim 1, wherein the first and second high electron mobility transistors have different threshold voltages.

3. The electronic device of claim 1, wherein the second high electron mobility transistor includes a Schottky-gated high electron mobility transistor.

4. The electronic device of claim 1, wherein the first high electron mobility transistor is an enhancement-mode transistor, and the second high electron mobility transistor is a depletion-mode transistor.

5. The electronic device of claim 1, wherein the second high mobility electron transistor further comprises a dielectric layer disposed between the second gate electrode and the channel layer.

6. The electronic device of claim 5, wherein the dielectric layer has a relative permittivity and a thickness, wherein a ratio of the relativity permittivity divided by the thickness is at least $0.62$ $nm^{-1}$.

7. The electronic device of claim 6, wherein the ratio of the relative permittivity divided by the thickness is at most $3.9$ $nm^{-1}$.

8. The electronic device of claim 5, wherein the dielectric layer comprises $Si_3N_4$, $Al_2O_3$, $ZrO_2$, $HfO_2$, $SiO_2$, $TiO_2$, $Ta_2O_5$, or $Nb_2O_3$.

9. The electronic device of claim 1, wherein a threshold voltage of the second high electron mobility transistor is in a range from $-1$ V to $-4$ V.

10. The electronic device of claim 1, wherein the second high electron mobility transistor is configured to limit current to at most 0.4 A/mm.

11. The electronic device of claim 1, wherein:
the first high electron mobility transistor is an enhancement-mode transistor,
the second high electron mobility transistor is a Schottky-gated transistor or a depletion-mode transistor.

12. The electronic device of claim 11, wherein a threshold voltage of the second high electron mobility transistor is in a range from −1 V to −4 V, and the second high electron mobility transistor is configured to limit current to at most 0.4 A/mm.

13. A process of forming an electronic device comprising:
forming a first gate electrode of a first high electron mobility transistor;
forming a drain electrode of the first high electron mobility transistor over a channel layer;
forming a source electrode of a second high electron mobility transistor, wherein a lowermost portion of the source electrode overlies at least a portion of the channel layer; and
forming a gate electrode of a second high electron mobility transistor, wherein:
the gate electrode of the second high electron mobility transistor is electrically connected to the source electrode of the second high electron mobility transistor, and
a source of the first high electron mobility transistor is coupled to a drain of the second high electron mobility transistor.

14. The process of claim 13, wherein:
forming the source electrode comprises forming the source electrode such that it forms an ohmic contact with the channel layer or a barrier layer overlying the channel layer;
forming the drain electrode comprises forming the drain electrode such that it forms an ohmic contact with the barrier layer or the channel layer; and
forming the gate electrode of the second high electron mobility transistor comprises forming a Schottky contact between a metal-containing layer and the barrier layer or the channel layer.

15. The process of claim 13, wherein forming the second high electron mobility transistor comprises forming a dielectric layer before forming the second gate electrode, wherein the dielectric layer is part of the second high electron mobility transistor.

16. The process of claim 13, wherein forming the first gate electrode comprises forming a p-type semiconductor layer over a first gate region of the first high electron mobility transistor.

17. The process of claim 13, further comprising:
forming an interlevel dielectric layer; and
patterning the interlevel dielectric layer to define contact openings for the source electrode of the second high electron mobility transistor and the gate electron of the second high electron mobility transistor,
wherein forming the source electrode of the source electrode of the second high electron mobility transistor and forming the gate electron of the second high electron mobility transistor comprises:
depositing a conductive layer over the interlevel dielectric layer and within the contact openings; and
patterning to the conductive layer to form an interconnect that includes:
a source electrode portion corresponding to the source electrode of the second high electron mobility transistor; and
a gate electrode portion corresponding to the gate electrode of the second high electron mobility transistor and a gate portion.

18. A circuit comprising:
a drain terminal;
a source terminal;
a gate terminal;
a first high electron mobility transistor including a drain, a source, and a gate, wherein:
the drain of the first high electron mobility transistor is coupled to the drain terminal, and
the gate of the first high electron mobility transistor is coupled to the gate terminal; and
a second high electron mobility transistor including a drain, a source, and a gate, wherein:
the drain of the second high electron mobility transistor is coupled to the source of the first high electron mobility transistor,
the source of the second high electron mobility transistor is electrically connected to the gate of the second high electron mobility transistor,
the source and gate of the second high electron mobility transistor arc coupled to the source terminal, and
the second high electron mobility transistor is a Schottky-gated high electron mobility transistor.

19. The circuit of claim 18, wherein the second high electron mobility transistor includes a Schottky-gated high electron mobility transistor.

20. The circuit of claim 18, wherein the second high electron mobility transistor is configured to limit current to at most 0.4 A/mm.

* * * * *